(12) United States Patent
Kim

(10) Patent No.: US 7,830,205 B2
(45) Date of Patent: Nov. 9, 2010

(54) FUSE CIRCUIT FOR USE IN A SEMICONDUCTOR INTEGRATED APPARATUS

(75) Inventor: Gyung Tae Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 61 days.

(21) Appl. No.: 12/171,233

(22) Filed: Jul. 10, 2008

(65) Prior Publication Data

US 2009/0179690 A1    Jul. 16, 2009

(30) Foreign Application Priority Data

Jan. 15, 2008    (KR) ...................... 10-2008-0004187

(51) Int. Cl.
*G11C 17/16* (2006.01)
*G06F 11/20* (2006.01)

(52) U.S. Cl. ........................ 327/565; 327/595; 327/525; 365/200; 365/225.7

(58) Field of Classification Search ........................ None
See application file for complete search history.

(56) References Cited

U.S. PATENT DOCUMENTS

| | | | | |
|---|---|---|---|---|
| 5,590,085 A | * | 12/1996 | Yuh et al. | ............... 365/230.03 |
| 5,889,679 A | | 3/1999 | Henry et al. | |
| 5,907,513 A | * | 5/1999 | Kato | ............................ 365/200 |
| 6,353,570 B2 | * | 3/2002 | Hwang et al. | ............. 365/225.7 |
| 7,057,441 B2 | * | 6/2006 | Yoon | ............................ 327/526 |
| 7,068,553 B2 | * | 6/2006 | Lee | ............................... 365/200 |
| 7,093,171 B2 | | 8/2006 | Hsu et al. | |
| 7,227,207 B2 | | 6/2007 | Park et al. | |
| 7,307,910 B2 | * | 12/2007 | Nam et al. | ................ 365/225.7 |
| 7,391,660 B2 | * | 6/2008 | Koo | ............................ 365/200 |
| 7,570,536 B2 | * | 8/2009 | Chi | ............................ 365/222 |

FOREIGN PATENT DOCUMENTS

| | | |
|---|---|---|
| JP | 2002-197884 | 7/2002 |
| KR | 1020020049386 A | 6/2002 |
| KR | 1020030067891 A | 8/2003 |
| KR | 1020040095933 | 11/2004 |

* cited by examiner

*Primary Examiner*—Lincoln Donovan
*Assistant Examiner*—Terry L Englund
(74) *Attorney, Agent, or Firm*—Baker & McKenzie LLP

(57) ABSTRACT

A fuse circuit of a semiconductor integrated apparatus includes first and second fuse blocks. The first fuse block includes a first up fuse block where a first plurality of fuses are arranged and a first down fuse block where a second plurality of fuses are arranged. The second plurality of fuses comprises fewer fuses than the first plurality of fuses. The second fuse block includes a second up fuse block where a third plurality of fuses are arranged, the third plurality of fuses comprising the same number of fuses as the second plurality of fuses, and a second down fuse block that includes a fourth plurality of fuses, the fourth plurality of fuses comprising the same number of fuses as the first plurality of fuses. The first up fuse block is opposite the second up fuse block and the first down fuse block is opposite the second down fuse block.

25 Claims, 4 Drawing Sheets

FUSE CIRCUIT FOR USE IN A SEMICONDUCTOR INTEGRATED APPARATUS

CROSS-REFERENCES TO RELATED APPLICATION

The present application claims priority under 35 U.S.C. 119(a) to Korean application number 10-2008-0004187, filed in the Korean Intellectual Property Office on Jan. 15, 2008, which is incorporated by reference in its entirety as if set forth in full.

BACKGROUND

1. Technical Field

The embodiments described herein relate to a semiconductor integrated apparatus, and more particularly, to a semiconductor integrated apparatus comprising a fuse circuit that occupies a reduced area.

2. Related Art

In general, even a defect in a single memory cell of a semiconductor apparatus comprising a large number of minute cells can result in operational errors. Therefore, a repair process for substituting a defective cell with a normal memory cell should be performed.

In order to perform such a repair process, a semiconductor integrated apparatus includes a repair circuit, which is provided with a fuse circuit that can be used to determine whether a memory cell is a defective cell or a normal cell. The fuse circuit includes a plurality of fuses, and stores address information related to defective cells according to the connection states of the fuses.

When receiving an external address, the semiconductor integrated apparatus compares the external address with the defective cell address information stored in the fuse box. If the external address and the defective fuse address information correspond to each other, then a defective cell is being addressed and will be substituted with another normal cell.

In order to substitute out a defective cell, repair fuses are disposed in a, e.g., Dynamic Random Access Memory (DRAM). A conventional repair fuse circuit is shown in FIG. 2. As can be seen, this particular circuit has a four-column structure.

A schematic diagram if a conventional fuse circuit 200 is shown in FIG. 1. As can be seen, circuit 200 includes first to sixteenth fuses F0 to F15, first to sixteenth NMOS transistors N1 to N16, a first connection fuse C1, a second connection fuse C2, and a column repair address circuit 10.

One end of each of the first to eighth fuses F0 to F7 is connected in common to a first node Node_1 and the other ends thereof are connected to the first to eighth NMOS transistors N1 to N8, respectively.

One end of each of the ninth to sixteenth fuses F8 to F15 are connected in common to a second node Node_2 and the other ends thereof are connected to the ninth to sixteenth NMOS transistors N9 to N16, respectively.

The fuses F0 to F15 correspond to a plurality of mats and the fuse circuit 200 is configured so that, when failure occurs in a mat, a fuse corresponding to the mat is cut.

The first connection fuse C1 has one end connected to the first node Node_1 and the other end connected to a third node Node_3. The second connection fuse C2 has one end connected to the second node Node_2 and the other end connected to the third node Node_3.

The first to sixteenth NMOS transistors N1 to N16 are connected in series to corresponding fuses, respectively, and receive mat selection signals 'XMAT_YF<0:15>' through gates thereof. The mat selection signals 'XMAT_YF<0:15>' may be enabled as the corresponding cell mats are selected.

The column repair address circuit 10 generates a column repair address signal according to the voltage on the third node Node_3.

If a fuse corresponding to a selected mat is cut, the column repair address signal is output at a high level. This represents that the selected mat has been repaired by a repair cell mat. For example, if the second fuse F1 has been cut when the second mat selection signal 'XMAT_YF<1>' is enabled, the column repair address signal transitions to a high level. Therefore, it can be seen that the second cell mat has been repaired.

Referring again to FIG. 2, a semiconductor integrated apparatus 1 may include a plurality of blocks, and each block may include first to sixteenth fuses F0 to F15, a first connection fuse C1, a second connection fuse C2, and two dummy fuses D1 and D2. As mentioned above, the fuse circuit of each block has a four-column structure, and a plurality of fuses each of which is disposed in the individual columns according to a predetermined pattern. For example, the first to fourth fuses F0 to F3 and the dummy fuse D1 are disposed in the first column. The fifth to eighth fuses F4 to F7 and the first connection fuse C1 are disposed in the second column. The ninth to twelfth fuses F8 to F11 and the second connection fuse C2 are disposed in the third column. The thirteenth to sixteenth fuses F12 to F15 and the dummy fuse D2 are disposed in the fourth column.

The first connection fuse C1 is connected to the second connection fuse C2 so as to connect the first to eighth fuses F0 to F7 to the ninth to sixteenth fuses F8 to F15.

In each fuse circuit, five fuses are disposed at predetermined intervals and the individual columns have the same area. The fuse circuit includes two dummy fuses disposed between fuses for direct connection and symmetry between four columns. As a result, the area of the fuse circuit increases. In other words, while the dummy fuses provide a symmetrical structure; the dummy fuses cause an unnecessary increase in area, which hinders the level of integration that can be achieved.

SUMMARY

A fuse circuit of a semiconductor integrated apparatus capable of reducing the area occupied by the fuses and therefore the overall fuse circuit is described herein.

According to one aspect, a semiconductor integrated apparatus includes a first fuse block including a first up fuse block that includes a first plurality of fuses and a first down fuse block that includes a second plurality of fuses, wherein the second plurality of fuses comprises fewer fuses than the first plurality of fuses; and a second fuse block including a second up fuse block that includes a third plurality of fuses, wherein the third plurality of fuses comprises the same number of fuses as the second plurality of fuses, and a second down fuse block that includes a fourth plurality of fuses, wherein the fourth plurality of fuses comprises the same number of fuses as the first plurality of fuses.

According to another aspect, a first fuse block including a first up fuse block that includes a first plurality of fuses and a first down fuse block that includes a second plurality of fuses, wherein the second plurality of fuses includes fewer fuses than the first plurality of fuses; a second fuse block including a second up fuse block that includes a third plurality of fuses, wherein the third plurality of fuses includes the same number of fuses as the second plurality of fuses, and a second down fuse block that includes a fourth plurality of fuses, wherein the fourth plurality of fuses includes the same number of fuses as the first plurality of fuses; a plurality of transistors connected to the fuses of the first and second fuse blocks and configured to transmit data to the individual fuses according to block selection signals; and a column repair address circuit coupled with the first and second fuse blocks, the column repair circuit configured to be driven according to data transmitted from the fuses of the first and second fuse blocks.

According to still another aspect, a semiconductor integrated apparatus includes a first fuse block including a first plurality of fuses, a second fuse block disposed in parallel with the first fuse block and including a second plurality of fuses, wherein the first fuse block and the second fuse block are asymmetric and a first connection unit connecting the first fuse block to the second fuse block.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 3:
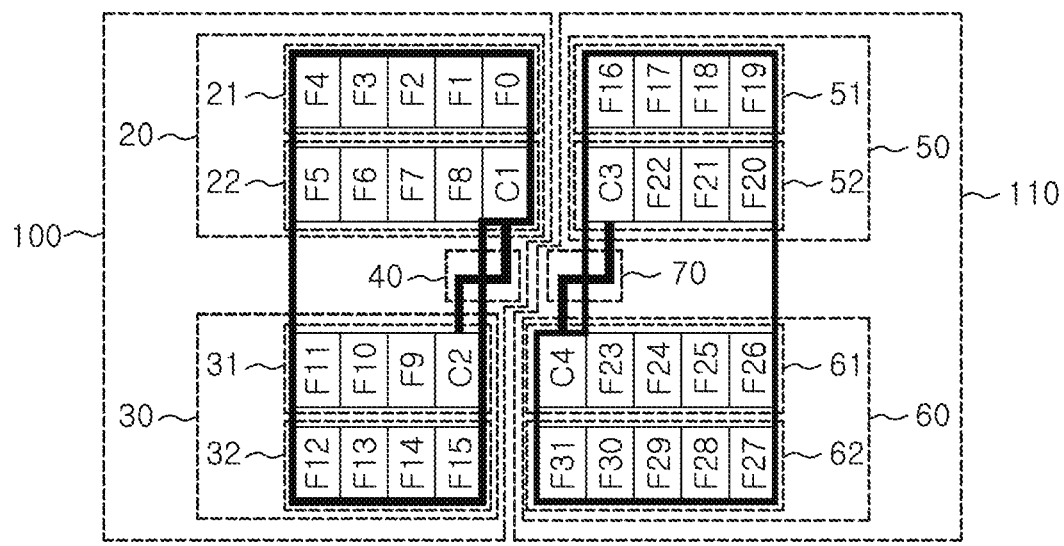
FIG. 3 is a layout diagram illustrating a configuration of a fuse circuit disposed in a semiconductor integrated apparatus according to one embodiment.

FIG. 3 is a diagram illustrating a semiconductor apparatus 120 that includes a fuse circuit configured in accordance with one embodiment. Referring to FIG. 3, it can be seen that the semiconductor integrated apparatus 120 can include a first fuse block 100 and a second fuse block 110.

The first fuse block 100 can include a first up fuse block 20, a first down fuse block 30, and a first connection unit 40. The first up fuse block 20, the first down fuse block 30, and the first connection unit 40 are disposed in the same plane.

The first up fuse block 20 includes a plurality of fuses which are disposed in a plurality of rows. The first up fuse block 20 includes a first fuse set composed of a plurality of fuses, in this case fuses F0 to F8, and a first connection fuse C1. The fuses F0 to F8 and the connection fuse C1 are disposed in two rows and the same number of fuses is disposed in individual rows. The placement of fuses in each row is accordance with a predetermined pattern.

The first connection fuse C1 can be connected to a second connection fuse C2 by the first connection unit 40. In the diagram, the first connection unit 40 has a bent portion for connecting the first connection fuse C1 to the second connection fuse C2.

The first connection unit 40 can for example comprise wiring lines configured to form the necessary connections.

FIG. 3 illustrates an example implementation wherein the first up fuse block 20 includes nine fuses F0 to F8 and the first connection fuse C1, and the first down fuse block 30 is composed of 8 fuses F9 to F15 and the second connection fuse C2. That is, structures of the first up fuse block 20 and the first down fuse block 30 are asymmetric.

More specifically, the first up fuse block 20 can include a first fuse sub-block 21 and a second fuse sub-block 22. The first fuse sub-block 21 can include five of the fuses F0 to F8, e.g., fuses F0 to F4, disposed in accordance with a predetermined pattern.

The second fuse sub-block 22 can be disposed in a row below the first fuse sub-block 21, and can include four of the fuses F0 to F8, e.g., fuses F5 to F8, and the first connection fuse C1. The sixth to ninth fuses F5 to F8 can be disposed in accordance with a predetermined pattern.

Due to the asymmetry, the first down fuse block 30 includes fewer fuses than the first up fuse block 20. In other words, the first down fuse block 30 can include a fewer fuses, e.g., fuses F9 to F15, than the first up fuse block 20. The first down fuse black can also comprise the second connection fuse C2. The fuses F9 to F15 and the second connection fuse C2 can be disposed in two rows according to a predetermined pattern. As with the first up fuse black 20, the same number of fuses is disposed in individual rows of the first down fuse block 30.

The first down fuse block 30 can be said to include a third fuse sub-block 31 and a fourth fuse sub-block 32. The third fuse sub-block 31 can be disposed in a row below the second fuse sub-block 22, and three of the fuses, e.g., fuses F9 to F11, and the second connection fuse C2 can be disposed in the third fuse sub-block 31 according to a predetermined pattern. The fourth fuse sub-block 32 can be disposed in a row below the third fuse sub-block 31. Four of the fuses, e.g., fuses F12 to F15, can be disposed in the fourth fuse sub-block 32 according to a predetermined pattern.

The second fuse block 110 can include a second up fuse block 50, a second down fuse block 60, and a second connection unit 70. The second up fuse block 50 can include same number of fuses as the first down fuse block 30, and the second down fuse block 60 can include the same number of fuses as the first up fuse block 20.

The second up fuse block 50 can include a plurality of fuses F16 to F22, and a third connection fuse C3. The fuses F16 to F22 and the third connection fuse C3 can be disposed in two rows according to a predetermined pattern, and the same number of fuses can be disposed in individual rows.

The second down fuse block 60 can include a plurality of fuses F23 to F31, and a fourth connection fuse C4. The fuses F23 to F31 and the fourth connection fuse C4 can be disposed in two rows according to a predetermined pattern, and the same number of fuses can be disposed in the individual rows.

The second connection unit 70 connects the third connection fuse C3 to the fourth connection fuse C4.

Specifically, FIG. 3 illustrates an implementation wherein the second up fuse block 50 is composed of eight fuses including seventeenth to twenty-third fuses F16 to F22 and the third connection fuse C3, and the second down fuse block 60 is composed of ten fuses including the twenty-fourth to thirty-second fuses F23 to F31 and the second connection fuse C2.

The second up fuse block 50 can be said to include a fifth fuse sub-block 51 and a sixth fuse sub-block 52. The fifth fuse sub-block 51 can be disposed on one side of the first fuse sub-block 21 and can include four of the fuses, e.g., fuses F16 to F19 disposed in the fifth fuse sub-block 51 according to a predetermined pattern.

The sixth fuse sub-block 52 can be disposed in a row below the fifth fuse sub-block 51 and can include the third connection fuse C3 and three of the fuses, e.g., fuses F20 to. The twenty-first to twenty-third fuses F20 to F22 and the third connection fuse C3 can be disposed in the sixth fuse sub-block 52 according to a predetermined pattern.

The second down fuse block 60 can be said to include a seventh fuse sub-block 61 and an eighth fuse sub-block 62.

The seventh fuse sub-block 61 can be disposed in a row below the sixth fuse sub-block 52, and can include the fourth connection fuse C4 and four of the fuses, e.g., fuses F23 to F26. The twenty-fourth to twenty-seventh fuses F23 to F26 and the fourth connection fuse C24 can be disposed in the seventh fuse sub-block 61 according to a predetermined pattern.

The eighth fuse sub-block 62 can be disposed in a row below the seventh fuse sub-block 61, and can include five of the fuses, e.g., fuses F27 to F31. The twenty-eighth to thirty-second fuses F27 to F31 can be disposed in the eighth fuse sub-block 62 according to a predetermined pattern.

Figure 4:
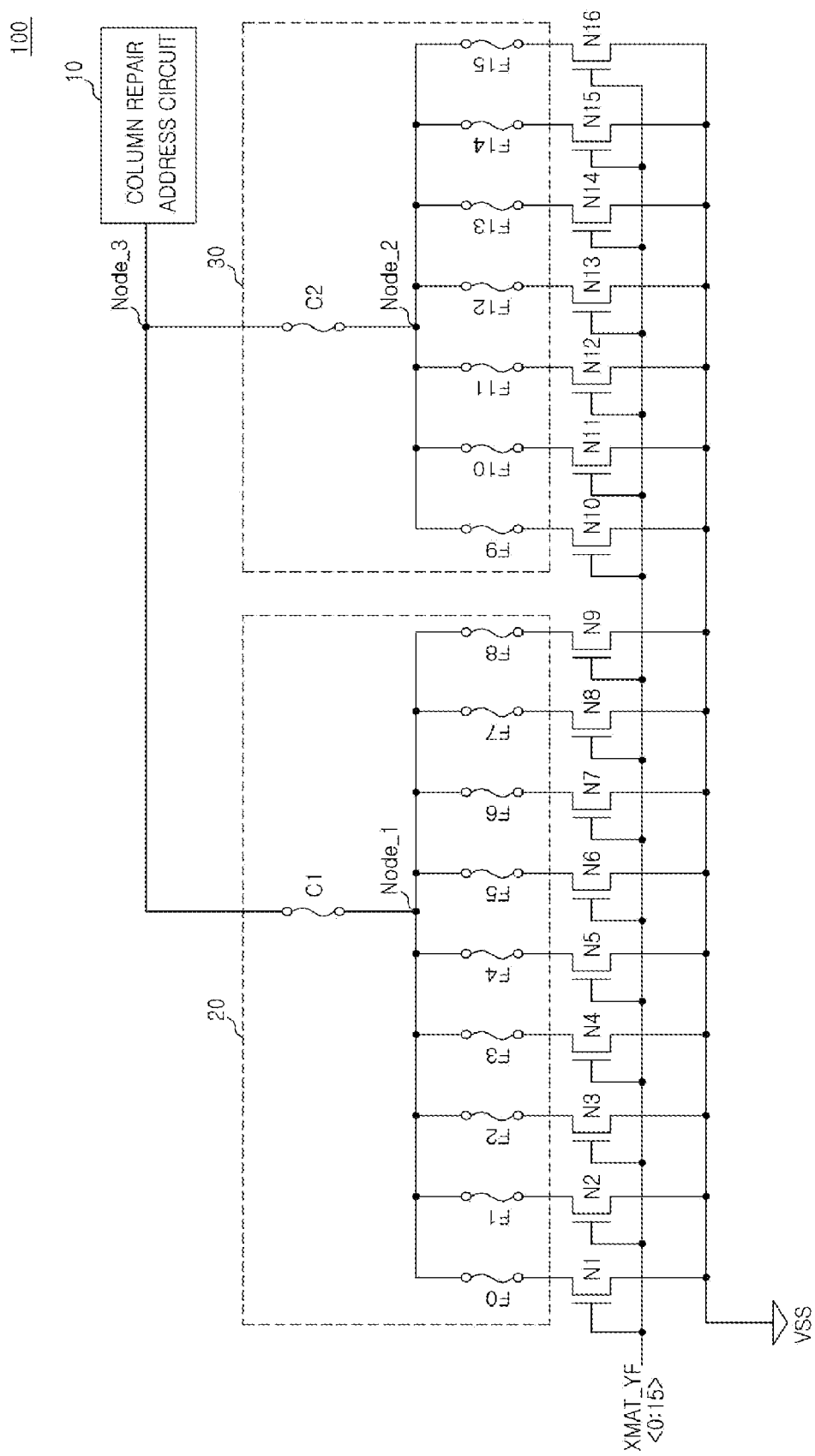
FIG. 4 is a schematic diagram illustrating the fuse circuit shown in FIG. 3 in more detail.

FIG. 4 is a schematic diagram illustrating an example circuit level implementation of the first fuse blocks 100. Referring to FIG. 4, the fuse block 100 comprises the first to sixteenth fuses F0 to F15, the first to sixteenth NMOS transistors N1 to N16, the first connection fuse C1, the second connection fuse C2, and the column repair address circuit 10.

The first to ninth fuses F0 to F8 constituting the first up fuse block 20 can be connected to the first to ninth NMOS transistors N1 to N9, respectively, and also are connected to the first connection fuse C1 at a first node Node_1.

Further, the tenth to sixteenth fuses F9 to F15 constituting the first down fuse block 30 can be connected to the tenth to sixteenth NMOS transistors N10 to N16, respectively, and also are connected to the second connection fuse C2 at a second node Node_2.

The first to sixteenth NMOS transistors N1 to N16 receive mat selection signals 'XMAT_YF<0:15>' through gates thereof.

One end of the first connection fuse C1 can be connected to the first node Node_1 and the other end thereof is connected to the third node Node_3. Further, one end of the second connection fuse C2 is connected to the second node Node_2, and the other end thereof is connected to the third node Node_3.

The column repair address circuit 10 can be configured to generate a column repair address signal according to the voltage on the third node Node_3. The column repair address circuit 10 can, e.g., be implemented in a conventional manner.

Figure 1:
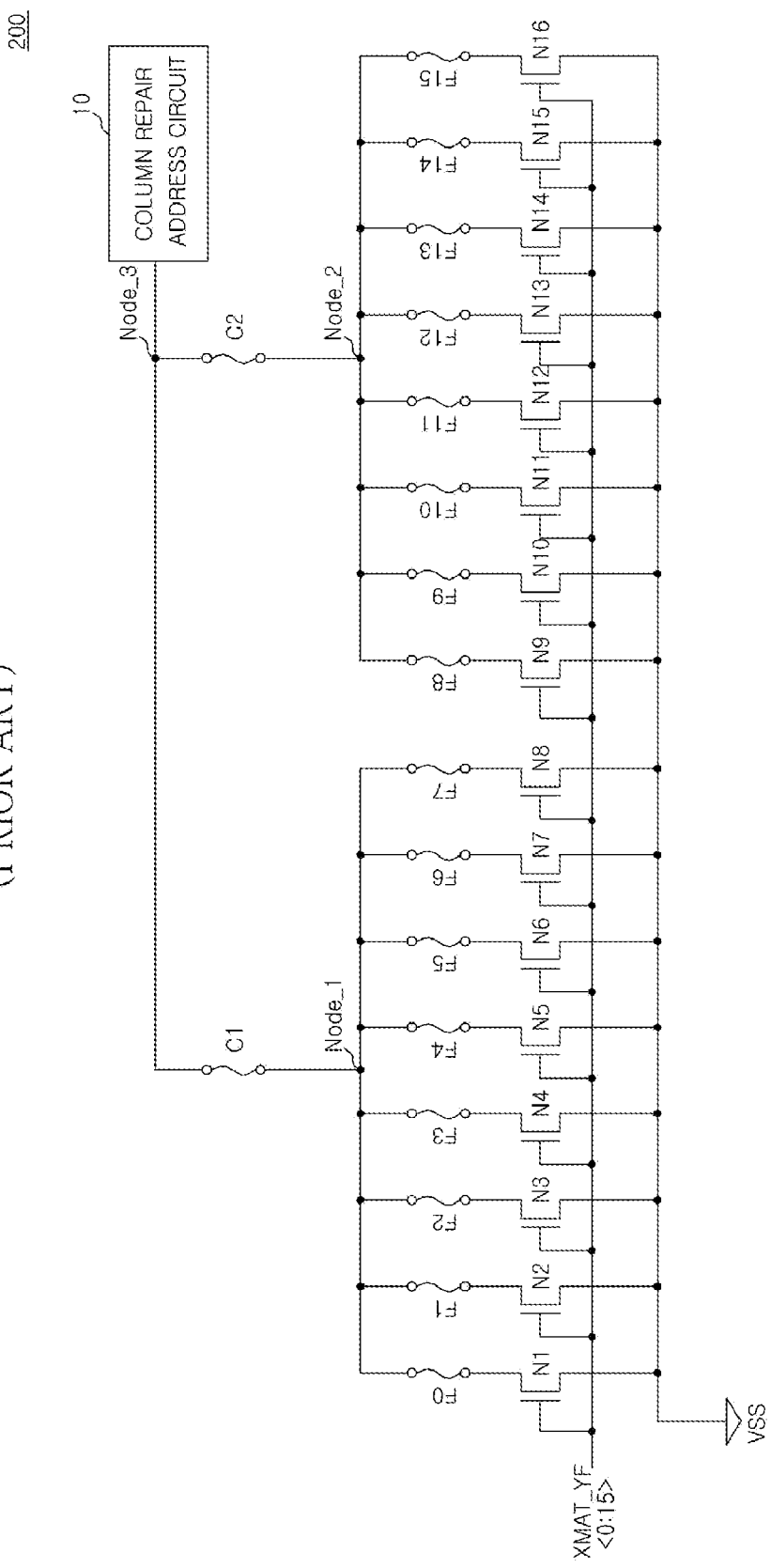
FIG. 1 is a schematic diagram illustrating a portion of a conventional fuse circuit for use in a semiconductor integrated apparatus.
Figure 2:
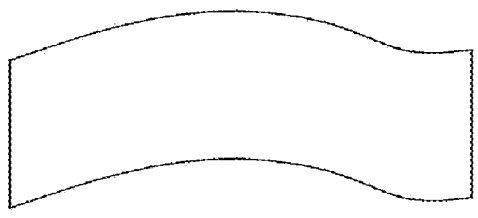
FIG. 2 is a diagram illustrating a conventional fuse circuit as implemented in a semiconductor integrated.

In the fuse sub block 100 shown in FIG. 4, the number of fuses connected to the first connection fuse C1 is not equal to the number of fuses connected to the second connection fuse C2, unlike the fuse circuit 200 shown in FIG. 1. Rather, as mentioned, the first to ninth fuses F0 to F8 are connected to the first connection fuse C1, and the tenth to sixteenth fuses F9 to F15 are connected to the second connection fuse C2.

The operation of the fuse circuit can be the same as that of the fuse circuit 200. In other words, if a fuse corresponding to a selected mat is cut, then a column repair address signal is output at a high level. This represents that the selected mat has been repaired. For example, if the second fuse F1 is cut, then the column repair address signal transitions to a high level when the second mat selection signal 'XMAT_YF<1>' is enabled. Therefore, it can be seen that the second mat has been repaired.

But as can be seen, by using the asymmetrical approach illustrated in FIG. 3, the dummy fuses can be eliminated and it is possible to reduce the area by the width of one fuse for every two fuse block, e.g., fuse blocks 100 and 110, which can lead to an increase in the level of integration.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor integrated apparatus comprising:
   a first fuse block including a first up fuse block where a first plurality of fuses are arranged and a first down fuse block where a second plurality of fuses are arranged, wherein the second plurality of fuses comprises fewer fuses than the first plurality of fuses; and
   a second fuse block including a second up fuse block where a third plurality of fuses are arranged, wherein the third plurality of fuses comprises the same number of fuses as the second plurality of fuses, and a second down fuse block that includes a fourth plurality of fuses, wherein the fourth plurality of fuses comprises the same number of fuses as the first plurality of fuses,
   wherein the first up fuse block is opposite to the second up fuse block and the first down fuse block is opposite to the second down fuse block.

2. The semiconductor integrated apparatus of claim 1, wherein the first up fuse block further includes a first connection fuse, and wherein the first connection fuse and the first plurality of fuses are disposed in two rows and the numbers of the fuses disposed in each of the two rows are the same.

3. The semiconductor integrated apparatus of claim 2, wherein the first down fuse block further includes a second connection fuse, and wherein the second connection fuse and the second plurality of fuses are disposed in two rows and the numbers of the fuses disposed in each of the two rows are the same.

4. The semiconductor integrated apparatus of claim 3, further comprising a first connection unit coupled with the first up fuse block and the first down fuse block, wherein the first connection unit is configured to connect the first connection fuse to the second connection fuse.

5. The semiconductor integrated apparatus of claim 4, wherein the first connection unit comprises a wiring structure for connecting the first connection fuse to the second connection fuse.

6. The semiconductor integrated apparatus of claim 4, wherein the second up fuse block further includes a third connection fuse, and wherein the third connection fuse and the third plurality of fuses are disposed in two rows and the numbers of the fuses disposed in each of the two rows are the same.

7. The semiconductor integrated apparatus of claim 6, wherein the second down fuse block further includes a fourth connection fuse, and wherein the fourth connection fuse and the fourth plurality of fuses are disposed in two rows and the numbers of the fuses disposed in each of the two rows are the same.

8. The semiconductor integrated apparatus of claim 7, further comprising a second connection unit coupled with the second up fuse block and the second down fuse block for connecting the third connection fuse to the fourth connection fuse.

9. The semiconductor integrated apparatus of claim 8, wherein the second connection unit comprises a wiring structure for connecting the third connection fuse to the fourth connection fuse.

10. A fuse circuit of a semiconductor integrated apparatus, the fuse circuit comprising:
    a first fuse block including a first up fuse block that includes a first plurality of fuses and a first down fuse block that includes a second plurality of fuses, wherein the second plurality of fuses includes fewer fuses than the first plurality of fuses;

a second fuse block including a second up fuse block that includes a third plurality of fuses, the second up fuse block being configured to be opposite to the first up fuse block, wherein the third plurality of fuses includes the same number of fuses as the second plurality of fuses, and a second down fuse block that includes a fourth plurality of fuses, the second down fuse block being configured to be opposite to the first down fuse block, wherein the fourth plurality of fuses includes the same number of fuses as the first plurality of fuses;

a plurality of transistors connected to the fuses of the first and second fuse blocks and configured to transmit data to the individual fuses according to block selection signals; and a column repair address circuit coupled with the first and second fuse blocks, the column repair address circuit configured to be driven according to data transmitted from the fuses of the first and second fuse blocks.

11. The fuse circuit of claim 10, wherein the first up fuse block further includes a first connection fuse, and wherein the first connection fuse and the first plurality of fuses are disposed in two rows and the numbers of the fuses disposed in each of the two rows are the same.

12. The fuse circuit of claim 11, wherein the first down fuse block further includes a second connection fuse, and wherein the second connection fuse and the second plurality of fuses are disposed in two rows and the numbers of the fuses disposed in each of the two rows are the same.

13. The fuse circuit of claim 12, further comprising a first connection unit coupled with the first up fuse block and the first down fuse block for connecting the first connection fuse to the second connection fuse.

14. The fuse circuit of claim 12, wherein the second up fuse block further includes a third connection fuse, and wherein the third connection fuse and the third plurality of fuses are disposed in two rows and the numbers of the fuses disposed in each of the two rows are the same.

15. The fuse circuit of claim 14, wherein the second down fuse block further includes a fourth connection fuse, and wherein the fourth connection fuse and the fourth plurality of fuses are disposed in two rows and the numbers of the fuses disposed in each of the two rows are the same.

16. The fuse circuit of claim 15, further comprising a connection unit coupled with the second up fuse block and the second down fuse block for connecting the third connection fuse to the fourth connection fuse.

17. A semiconductor integrated apparatus, comprising:
a first fuse block including a first plurality of fuses and a first connection fuse;
a second fuse block disposed in parallel with the first fuse block and including a second plurality of fuses and a second connection fuse, wherein the first fuse block and the second fuse block are asymmetric; and
a first connection unit connecting the first connection fuse to the second connection fuse.

18. The semiconductor integrated apparatus of claim 17, wherein the first connection fuse and the first plurality of fuses are disposed in two rows, and the numbers of the fuses disposed in each of the two rows are the same.

19. The semiconductor integrated apparatus of claim 17, wherein the second connection fuse and the second plurality of fuses are disposed in two rows the numbers of the fuses disposed in each of the two rows are the same.

20. The semiconductor integrated apparatus of claim 17, wherein the first connection unit comprises a wiring structure for connecting the first connection fuse to the second connection fuse.

21. The semiconductor apparatus of claim 17, further comprising
a third fuse block including a third plurality of fuses, wherein the third plurality of fuses comprises the same number of fuses as the second plurality of fuses;
a fourth fuse block disposed in parallel with the third fuse block and including a fourth plurality of fuses, wherein the fourth plurality of fuses comprises the same number of fuses as the first plurality of fuses; and
a second connection unit connecting the third fuse block to the fourth fuse block.

22. The semiconductor integrated apparatus of claim 21, wherein the third fuse block further includes a third connection fuse, the third connection fuse and the third plurality of fuses are disposed in two rows and the numbers of the fuses disposed in each of the two rows are the same.

23. The semiconductor integrated apparatus of claim 22, wherein the fourth fuse block further includes a fourth connection fuse, the fourth connection fuse and the fourth plurality of fuses disposed in two rows according to a predetermined pattern with the same number of fuses disposed in each of the two rows.

24. The semiconductor integrated apparatus of claim 23, wherein the second connection unit comprises a wiring structure for connecting the third connection fuse to the fourth connection fuse.

25. The semiconductor integrated apparatus of claim 21, wherein the first and second fuse blocks are laid out in parallel with each other with the first fuse block above the second fuse block, and the third and fourth fuse blocks are laid out in parallel with each other with the third fuse block next to the first fuse block and above the fourth fuse block, which is next to the second fuse block.

* * * * *